United States Patent
Cheng et al.

(10) Patent No.: US 10,056,278 B2
(45) Date of Patent: Aug. 21, 2018

(54) APPARATUS AND METHOD FOR TRANSFERRING ELECTRONIC DEVICES

(71) Applicant: ASM Technology Singapore Pte Ltd, Singapore (SG)

(72) Inventors: Chi Wah Cheng, Tsing Yi (HK); Kai Fung Lau, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 80 days.

(21) Appl. No.: 15/243,640

(22) Filed: Aug. 22, 2016

(65) Prior Publication Data

US 2018/0053671 A1    Feb. 22, 2018

(51) Int. Cl.
*G06F 7/00* (2006.01)
*H05K 3/30* (2006.01)
*H01L 21/677* (2006.01)

(52) U.S. Cl.
CPC .. *H01L 21/67706* (2013.01); *H01L 21/67721* (2013.01); *H01L 21/67736* (2013.01)

(58) Field of Classification Search
None
See application file for complete search history.

(56) References Cited

U.S. PATENT DOCUMENTS

| 6,171,049 | B1 | 1/2001 | Wirz et al. |
| 2004/0163243 | A1* | 8/2004 | Noda .......... H05K 13/0452 29/834 |
| 2016/0306008 | A1* | 10/2016 | Wiesbock .......... G01R 31/2868 |

FOREIGN PATENT DOCUMENTS

| JP | 2012119494 | 6/2012 |
| WO | WO 2007/057291 | 5/2007 |

* cited by examiner

*Primary Examiner* — Yolanda Renee Cumbess
(74) *Attorney, Agent, or Firm* — Ostrolenk Faber LLP

(57) ABSTRACT

The present invention relates to an apparatus for transferring electronic devices from a holding unit to a processing station. The apparatus comprises first and second rotating mechanisms having a plurality of handlers and a plurality of holders respectively, an imaging mechanism, a processor and an adjusting mechanism. In use, a handler retrieves an electronic device from the holding unit and moves the device to a transfer position. A holder retrieves the electronic device from the handler at the transfer position and transfers the electronic device to the processing station. Prior to this retrieval, the adjusting mechanism adjusts a relative position between the holder and the handler at the transfer position. This adjustment is based on offsets calculated by the processor using images of the handler and holder captured by the imaging mechanism. The adjustment allows the electronic device to be retrieved more securely by the holder.

17 Claims, 7 Drawing Sheets

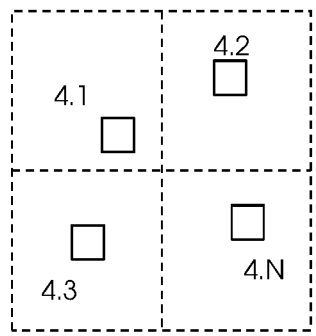
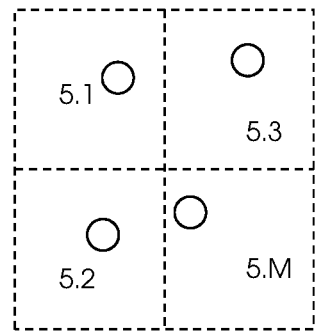
Fig. 4(a)  Fig. 4(b)
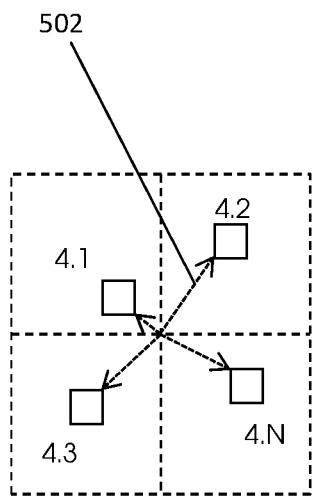
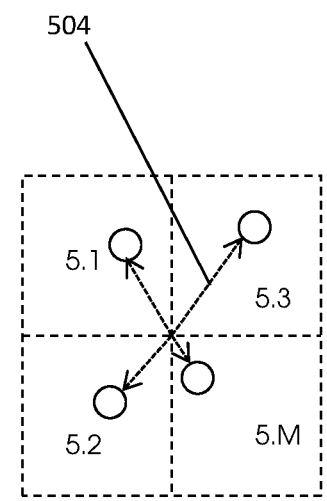
Fig. 5(a)  Fig. 5(b)

APPARATUS AND METHOD FOR TRANSFERRING ELECTRONIC DEVICES

FIELD OF THE INVENTION

The present invention relates to an apparatus and method for transferring electronic devices from a holding unit (for example, a receiving plate) to a processing station.

BACKGROUND OF THE INVENTION

Diced electronic devices are usually mounted on a receiving plate in such a way that their leads or electrical contact points face away from the plate. After picking up these devices from the receiving plate, the devices often have to be flipped so that subsequent processes such as functional testing or visual integrity checking can be performed on them.

Prior art methods have been developed to flip electronic devices before transferring them to processing stations for subsequent processes.

For example, U.S. Pat. No. 6,171,049 describes using an intermediate station for flipping a work-piece. In particular, a first head of a transfer unit is used to pick up the work-piece from the receiving plate and subsequently, the work-piece is brought to the intermediate station where it is flipped. A second head of the transfer unit then picks up the work-piece in this flipped position and transfers it to a processing station.

Further, WO2007057291 describes using a turntable for inverting electronic components. This turntable includes four locations, namely, a location (A) for loading the electronic components, a start-of-inversion location (B), an end-of-inversion location (C) and a location (D) for discharging the components from the turntable. An inverting device actuated by a fixed rotating motor is used to invert the electronic components between the start-of-inversion location (B) and the end-of-inversion location (C).

JP2012119494A describes using a vertical indexing wheel with extensible pick heads. Each pick-head retrieves a work-piece from a receiving plate and since the wheel rotates vertically, the electronic components are flipped as the wheel turns.

FIG. 1 shows another prior art apparatus 100 capable of flipping electronic devices before transferring them to processing stations 116. In particular, the apparatus 100 comprises a vertically rotating module 104 having a first main body 106 and a plurality of first pick heads 108, and a horizontally rotating module 110 having a second main body 112 and a plurality of second pick heads 114. Electronic devices are retrieved one at a time from the receiving plate 102 by the first pick heads 108. The electronic devices are flipped as the first main body 106 rotates. Hence, when the first pick head 108 reaches the position 109 via the rotation of the first main body 106, the electronic device it is carrying is in the flipped orientation. A second pick head 114 in the position 115 then retrieves the electronic device in the flipped orientation. Via a rotation of the second main body 112, the electronic device is transferred in this flipped orientation to the processing stations 116.

Although the prior art methods described above are able to flip the electronic devices, they involve multiple transfers of the electronic devices and this can lead to potential problems. For example, referring to the apparatus 100, each electronic device has to be transferred twice—once from the receiving plate 102 to a first pick head 108 and another time from the first pick head 108 to a second pick head 114. One problem arising from this is that each time the electronic device is transferred, there is a chance that the electronic device is not situated in the center of the pick head 108, 114 where the suction hole is. This increases the risk of dropping and hence, damaging the electronic device. This risk is higher when handling smaller electronic devices if the pick heads 108, 114 have suction holes that are so small that a slight offset of the electronic devices from their centers will cause the suction holes to be severely misaligned with respect to the devices.

A further problem with the apparatus 100 is that the distance between the center of the first main body 106 and each of the first pick heads 108 may vary. Similarly, the distance between the center of the second main body 112 and each of the second pick heads 114 may also vary. This is due to fabrication errors and errors introduced when the pick heads are changed (such changes are performed so as to handle different devices e.g. devices having different sizes and characteristics). Therefore, there is a chance that some of the first pick heads 108 may not centrally retrieve the electronic devices. Furthermore, the first pick head 108 at position 109 and the second pick head 114 at position 115 may not be aligned and this may cause the electronic device retrieved by the second pick head 114 to be offset from its center (even if the device was correctly picked at the center of the first pick head 108). As a result, the electronic device may drop. Manual adjustments of the positions of the pick heads 108, 114 are thus often needed. However, such adjustments require highly skilled workers and are extremely time consuming. Moreover, the chances of dropping an electronic device increase as the size of the electronic device decreases. Thus, it is especially risky for the apparatus 100 to handle very small electronic devices, in particular, those with a pick-up surface area of 0.6 mm×0.3 mm or less.

SUMMARY OF THE INVENTION

The present invention aims to provide a new and useful apparatus and method for transferring electronic devices from a holding unit to a processing station.

In general terms, the present invention proposes an apparatus having a plurality of holders and a plurality of handlers, with each holder configured to retrieve an electronic device from a respective handler, and an adjusting mechanism configured to adjust relative positions between respective pairs of holders and handlers prior to the retrieval of the electronic devices.

Specifically, a first aspect of the present invention is an apparatus for transferring electronic devices from a holding unit to a processing station, the apparatus comprising: a first rotating mechanism comprising a plurality of handlers, each handler configured to retrieve an electronic device from the holding unit and move the electronic device to a transfer position; a second rotating mechanism comprising a plurality of holders, each holder configured to retrieve the electronic device from a respective handler at the transfer position and transfer the electronic device to the processing station; an imaging mechanism configured to capture an image of each handler and each holder; a processor configured to calculate an offset between each holder and the respective handler at the transfer position using the captured images; and an adjusting mechanism configured to adjust a relative position between each holder and the respective handler at the transfer position based on the calculated offsets prior to the electronic device being retrieved by the holder.

With the above-mentioned apparatus, the offsets between the respective pairs of holders and handlers can be compensated by the adjustments. This allows the electronic devices to be more securely retrieved by the holders, hence reducing the chances of dropping and damaging the devices. Thus, the apparatus can be reliably used for transferring electronic devices including those which are very small in size. Further, since offsets between the pick heads can be compensated by the adjusting mechanism, the demand on part fabrication and alignment is less stringent, and precision machine parts are not required. The use of the adjusting mechanism also eliminates the need for manual adjustments of the pick heads after the pick heads have been changed. This helps to reduce the machine down time and improve machine throughput.

The holders and handlers may each comprise a retrieving element configured to retrieve the electronic device and the captured images may comprise images of the retrieving elements. The offsets calculated using such images can be more accurate since the retrieving elements are where the electronic devices will be retrieved.

The imaging mechanism may comprise a first camera configured to capture the images of the handlers and a second camera configured to capture the images of the holders. Having separate cameras to capture the images of the handlers and the holders allows each camera to be placed nearer the pick heads whose images they are capturing. It also allows the cameras to be opposite the portions of the pick heads configured to retrieve the electronic devices. This can improve the accuracy of the offsets calculated using the captured images.

The imaging mechanism may comprise both a down-look camera and an up-look camera. This can allow the cameras to capture images of the pick head portions configured to retrieve the electronic devices even if these portions are not facing the same direction.

The first and second rotating mechanisms may be configured to rotate perpendicular to each other. This allows the flipping of the electronic devices before they are transferred to the processing station. For example, the first rotating mechanism may be configured to rotate vertically and the second rotating mechanism may be configured to rotate horizontally.

The adjusting mechanism may be configured to move only the first rotating mechanism to adjust the relative position between each holder and the respective handler at the transfer position. The holders of the second rotating mechanism are configured to transfer the electronic devices to the processing station. Moving only the first rotating mechanism (and not the second rotating mechanism) eliminates the need to realign the second rotating mechanism with the processing station after each adjustment of the relative position between a holder and a handler. This in turn increases the efficiency and productivity of the apparatus.

The adjusting mechanism may be configured to move one or both of the rotating mechanisms along two perpendicular axes. This helps to adjust the relative position between each holder and the respective handler in two directions, and therefore a more accurate adjustment can be achieved.

Alternatively, the adjusting mechanism may be configured to move one or both of the rotating mechanisms along a single axis. This simplifies the adjusting mechanism, thus reducing the cost of manufacturing and maintaining the apparatus.

The one or both of the rotating mechanisms may be further configured to rotate to adjust the relative position between each holder and the respective handler along a second axis perpendicular to the single axis. This allows the adjustment of the relative positions between the holders and the respective handlers in two directions even with a simpler adjusting mechanism.

The apparatus may further comprise an image capturing device configured to capture an image of each holder after the holder retrieves the electronic device to determine a position of the electronic device relative to the holder. The adjusting mechanism may be configured to adjust the relative position between each holder and the respective handler based further on the determined position of the electronic device relative to the holder. This achieves a more accurate adjustment so the electronic device can be retrieved closer to the retrieving element of the holder, allowing the electronic device to be retrieved more securely by the holder.

The offsets may be calculated by: determining first deviations of the handlers from an expected handler stopping position; determining second deviations of the holders from an expected holder stopping position; and determining differences between the first and second deviations. Such a method of calculation simplifies the process of determining the offsets.

The deviations may be represented by vectors and the differences may be determined using the vectors. This further simplifies the calculation of the offsets.

The imaging mechanism may comprise cameras positioned opposite the expected handler and holder stopping positions. This allows the calculation of the first and second deviations using the captured images.

The expected handler stopping position may be located away from the expected holder stopping position. This provides more flexibility in the placement of the cameras.

A second aspect of the present invention is a method for transferring electronic devices from a holding unit to a processing station, the method comprising: capturing an image of each of a plurality of handlers; capturing an image of each of a plurality of holders; calculating an offset between each handler and a respective holder at a transfer position using the captured images; retrieving an electronic device from the holding unit and moving the electronic device to the transfer position using a handler; adjusting a relative position between the handler and the respective holder at the transfer position based on the calculated offsets; and retrieving the electronic device from the handler at the transfer position and transferring the electronic device to the processing station using the holder.

BRIEF DESCRIPTION OF THE FIGURES

Embodiments of the invention will now be illustrated by way of example only with reference to the following drawings, in which:

FIG. 4(a) and FIG. 4(b) respectively show images captured for flipper pick heads and turret pick heads of the apparatus of FIG. 2;

FIG. 5(a) and FIG. 5(b) respectively show the images of FIG. 4(a) and FIG. 4(b) with vectors representing deviations of the pick heads from expected stopping positions;

DETAILED DESCRIPTION OF THE EMBODIMENTS

Figure 1:
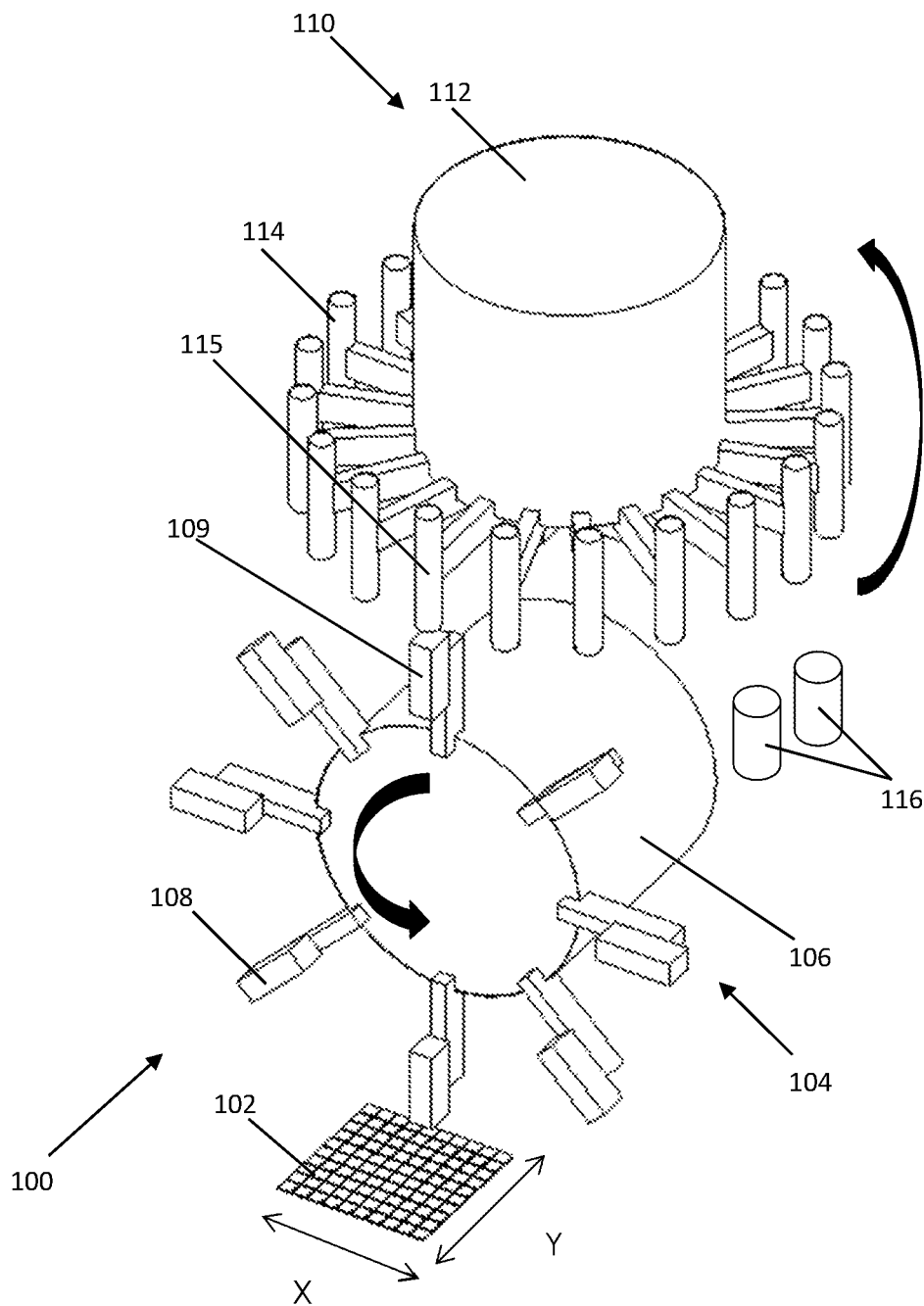
FIG. 1 shows a perspective view of a prior art apparatus for flipping electronic devices before transferring the devices to processing stations.
Figure 2:
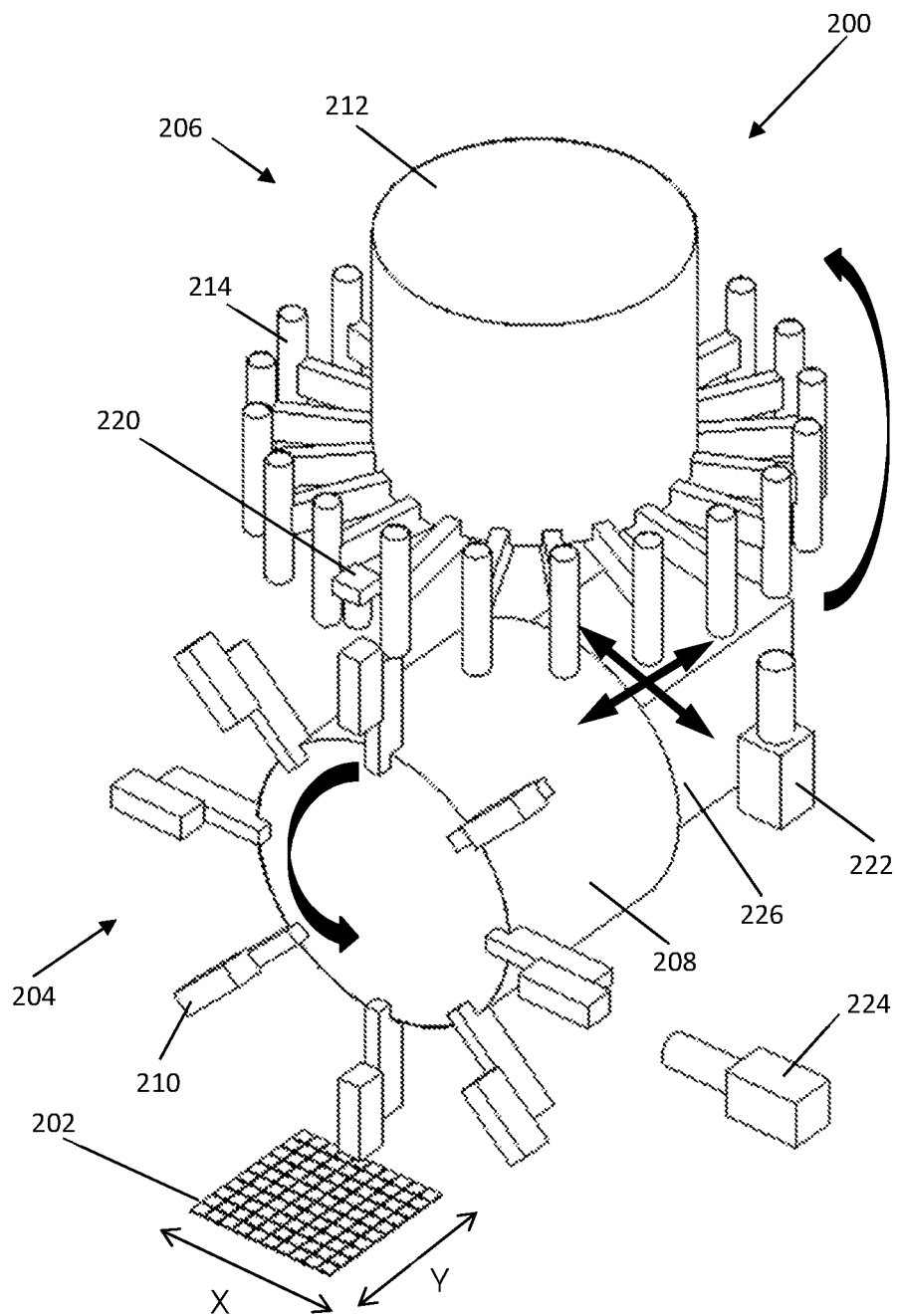
FIG. 2 shows a perspective view of an apparatus for transferring electronic devices from a holding unit to a processing station according to a first embodiment of the present invention.

FIG. 2 shows a perspective view of an apparatus 200 for transferring electronic devices from a holding unit in the form of a receiving plate 202 to a processing station (not shown in FIG. 2) according to a first embodiment of the present invention.

As shown in FIG. 2, the apparatus 200 comprises a first rotating mechanism in the form of a vertically rotating flipper 204 and a second rotating mechanism in the form of a horizontally rotating main turret 206.

The flipper 204 includes a cylindrical flipper body 208 and a plurality of handlers in the form of flipper pick heads 210. The flipper pick heads 210 are located at one end of the flipper body 208 and are distributed, spaced apart from one another, around a circumference of the flipper body 208. Similarly, the main turret 206 includes a cylindrical turret body 212 and a plurality of holders in the form of turret pick heads 214. The turret pick heads 214 are also located at one end of the turret body 212 around the circumference of the turret body 212, spaced apart from one another. In total, the apparatus 200 includes N flipper pick heads 210 and M turret pick heads 214. Each pick head 210, 214 has a longitudinal portion extending from the respective body 208, 212 and a head portion connected to the longitudinal portion. The head portion includes a surface with a retrieving element in the form of a suction hole at the center of the surface. The suction hole serves to attract an electronic device, so as to retrieve the device and secure the device against the pick head 210, 214.

The flipper body 208 and the turret body 212 are configured to repeatedly rotate anti-clockwise and stop. Ideally, after every rotation of the flipper body 208 and the turret body 212, all the flipper pick heads 210 and the turret pick heads 214 are at respective expected handler and holder stopping positions. This can allow one of the turret pick heads 214 (at a first expected holder stopping position) to be aligned with one of the flipper pick heads 210 (at a first expected handler stopping position) such that the turret pick head 214 retrieves the electronic device from the flipper pick head 210 with the center of the electronic device positioned at the center of the suction hole. However, the actual stopping positions of the pick heads 210, 214 may deviate from the respective expected handler and holder stopping positions due to fabrication errors and errors introduced during the changing of the pick heads 210, 214.

The apparatus 200 further comprises an adjusting mechanism in the form of an X/Y driving mechanism 226. This X/Y driving mechanism 226 comprises a casing which holds a motor. The motor is operable to move shafts connected to the flipper body 208, so as to move the flipper body 208 along two perpendicular axes, specifically the X and Y axes as shown in FIG. 2.

The apparatus 200 also includes an imaging mechanism configured to capture an image of each flipper pick head 210 and each turret pick head 214. The imaging mechanism comprises a first camera in the form of a down-look camera 220 and a second camera in the form of an up-look camera 222. The down-look camera 220 is connected to the turret body 212, whereas the up-look camera 222 is connected to the stationary casing of the X/Y driving mechanism 226. As shown in FIG. 2, the down-look camera 220 is positioned in between a pair of turret pick heads 214. The turret body 212 is configured to be capable of rotating by a certain angle to bring the center of the down-look camera 220 opposite the center of the first expected handler stopping position. The up-look camera 222 is positioned with its center opposite the center of an expected holder stopping position (specifically, five positions away from the first expected holder stopping position in the anti-clockwise direction).

In addition, the apparatus 200 comprises an image capturing device in the form of a side-look camera 224. The side-look camera 224 is positioned with its center at a position opposite the center of an expected handler stopping position (specifically, two positions away from the first expected handler stopping position in the clockwise direction).

Although not shown in FIG. 2, the apparatus 200 also includes a computing unit having a processor for processing data and a storage device for storing data.

In use, the apparatus 200 is initially set up with the flipper pick heads 210 and the turret pick heads 214 in respective actual stopping positions. For identification purposes, the pick heads 210, 214 are indexed based on their positions at the initial setup. Specifically, the flipper pick heads 210 are indexed from 4.1 to 4.N in the anti-clockwise direction starting from the flipper pick head 210 closest to the receiving plate 202. Similarly, the turret pick heads 214 are indexed from 5.1 to 5.M in the anti-clockwise direction starting from the turret pick head 214 closest to the first expected holder stopping position. The indices of the pick heads 210, 214 are stored in the storage device of the apparatus 200.

Figure 3:
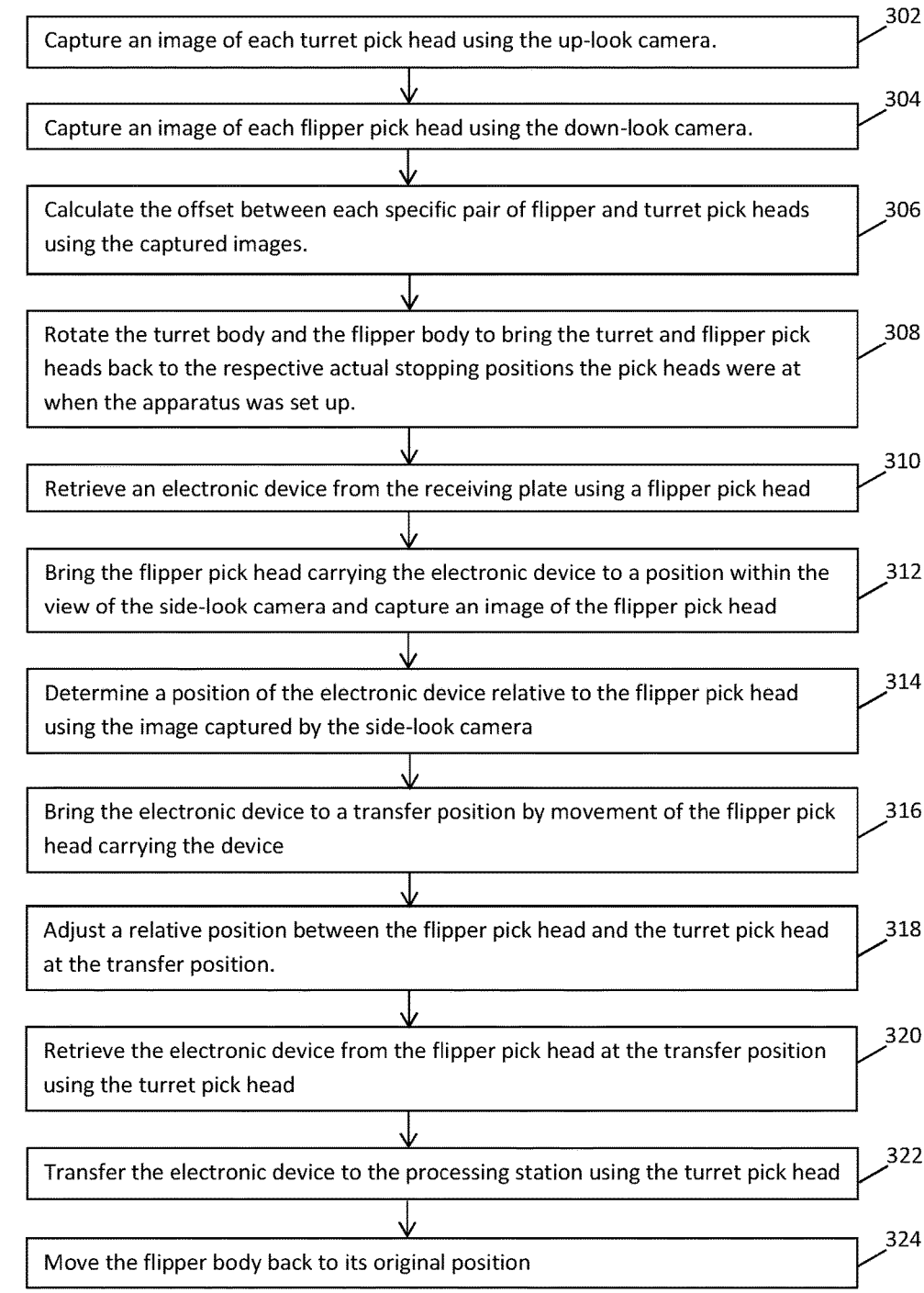
FIG. 3 shows a flow diagram of a method for transferring electronic devices from a holding unit to a processing station performed by the apparatus of FIG. 2.

After the initial setup, the apparatus 200 performs a method 300 (as shown in FIG. 3) for transferring electronic devices from the receiving plate 202 to the processing station. The method 300 includes steps 310-324 which are described in detail below.

In step 302, an image of each turret pick head 214 is captured using the up-look camera 222. In particular, the up-look camera 222 first captures an image of the turret pick head 214 that is located above it when the apparatus 200 is initially set up. The turret body 212 then rotates to bring a next turret pick head 214 to above the up-look camera 222 and an image of this next turret pick head 214 is captured. This is repeated until an image of every turret pick head 214 has been captured by the up-look camera 222.

In step 304, an image of each flipper pick head 210 is captured using the down-look camera 220. To elaborate, the turret body 212 is first rotated to bring the down-look camera 220 to a position where its center is in alignment with the center of the first expected handler stopping position. An image of the flipper pick head 210 below the down-look camera 220 is then captured. Next, the flipper body 208 rotates to bring a next flipper pick head 210 to below the camera 220 and an image of this next flipper pick head 210 is captured. This is repeated until an image of every flipper pick head 210 has been captured using the down-look camera 220.

FIG. 4(a) shows images captured for four flipper pick heads 210 (specifically, those indexed 4.1, 4.2, 4.3, 4.N) superimposed onto each other and onto a grid with dotted lines. FIG. 4(b) shows images captured for four turret pick heads 214 (specifically, those indexed 5.1, 5.2, 5.3, 5.M) superimposed onto each other and onto a grid with dotted lines. The centers of the grids in FIGS. 4(a) and 4(b) correspond to the centers of the cameras 220, 222 respectively. In other words, these centers correspond to the centers of the expected handler and holder stopping positions the cameras 220, 222 are opposite to. As shown in FIGS. 4(a) and 4(b), there are deviations between the actual stopping positions of the flipper and turret pick heads 210, 214 and the expected handler and holder stopping positions.

In step 306, the processor calculates the offset between each specific pair of flipper pick head 210 and turret pick head 214. In particular, the offset between the flipper pick head 210 indexed 4.1 and each of the turret pick heads 214 is first calculated, then the offset between the flipper pick head 210 indexed 4.2 and each of the turret pick heads 214 is calculated, and this goes on until the calculation has been performed for all of the remaining flipper pick heads 210 indexed 4.3-4.N. This gives rise to a total of N×M offsets since there are in total N flipper pick heads 210 and M turret pick heads 214. The offsets are then stored in the storage device.

The offsets are calculated using the captured images from steps 302, 304. FIGS. 5(a) and 5(b) illustrate this. FIGS. 5(a) and 5(b) are the same as FIGS. 4(a) and 4(b) respectively, except that FIGS. 5(a) and 5(b) further include vectors (e.g. vectors 502, 504). The vectors in FIG. 5(a) represent first deviations of the flipper pick heads 210 from the expected handler stopping position the down-look camera 220 is opposite to. The vectors in FIG. 5(b) represent second deviations of the turret pick heads 210 from the expected holder stopping position the up-look camera 220 is opposite to. The offsets are calculated by determining differences between the first and second deviations using the vectors. More specifically, the offset between a specific pair of flipper and turret pick heads 210, 214 is calculated by determining the delta of the vectors representing the deviations of these pick heads 210, 214 from the respective expected handler and holder stopping positions. As an example, referring to FIGS. 5(a) and 5(b), the offset between the flipper pick head 210 indexed 4.2 and the turret pick head 214 indexed 5.3 is calculated by determining the delta of the vectors 502, 504. Since there are a total of N flipper pick heads 210 and M turret pick heads 214, there are a total of N vectors representing the first deviations and M vectors representing the second deviations, and a total of M× N vectors representing the offsets between the specific pairs of pick heads 210, 214.

In step 308, the turret body is rotated to bring the turret pick heads 214 back to the respective actual stopping positions the turret pick heads 214 were at when the apparatus 200 was first set up. Similarly, the flipper body 208 is rotated to bring the flipper pick heads 210 back to the respective actual stopping positions the flipper pick heads 210 were at when the apparatus 200 was first set up.

In step 310, an electronic device is retrieved from the receiving plate 202 using a flipper pick head 210.

In step 312, the flipper pick head 210 carrying the electronic device is brought to a position within the view of the side-look camera 224 via the rotation of the flipper body 208, and an image of this flipper pick head 210 is captured using the side-look camera 224.

In step 314, a position of the electronic device relative to the flipper pick head 210 is determined using the captured image from step 312.

In step 316, the electronic device is brought to a transfer position by movement of the flipper pick head 210 carrying the device as the flipper pick head 210 moves with an anti-clockwise rotation of the flipper body 208. Referring to FIG. 2, this transfer position is at the top of the flipper 204 and is where the turret pick head 214 will retrieve the electronic device from the flipper pick head 210.

In step 318, a relative position between the flipper pick head 210 and the turret pick head 214 at the transfer position is adjusted. This is based on the calculated offsets from step 306 and the calculated position of the electronic device relative to the flipper pick head 210 from step 314. In particular, using the indices stored in the storage device when the apparatus 200 is first set up, the processor determines the specific pair of flipper and turret pick heads 210, 214 at the transfer position. The calculated offset between this specific pair of flipper and turret pick heads 210, 214 is then retrieved from the storage device. Based on this calculated offset and the position of the electronic device relative to the flipper pick head 210, the distances and directions along the X and Y axes to move the flipper body 208 are determined so that the electronic device can be retrieved by the turret pick head 214 at a center of the turret pick head 214. The flipper body 208 is then moved by the determined distances and in the determined directions using the X/Y driving mechanism 226. This causes the flipper pick head 210 at the transfer position to move correspondingly.

Although the cameras 220, 222 are not aligned with each other, the offsets calculated using images captured with these cameras 220, 222 can be used to align the flipper and turret pick heads 210, 214 at the transfer position. This is because of the following reasons. Firstly, the expected stopping positions are equidistantly distributed around the circumferences of the respective bodies 208, 212. Secondly, each body 208, 212 is configured such that each of its rotation before it stops moves the pick heads 210, 214 through a distance equal to the distance between neighbouring expected stopping positions. Due to the first and second reasons above, the deviation of a pick head 210, 214 from an expected stopping position will be the same as that from another expected stopping position. In other words, the deviation of a turret pick head 214 from the expected stopping position opposite the camera 222 is the same as the deviation of this pick head 214 from the first expected holder stopping position. Thirdly, the first expected holder stopping position is aligned with the first expected handler stopping position which is opposite the down-look camera 220. Therefore, based on the deviations of the pick heads 210, 214 from the respective expected stopping positions opposite the respective cameras 220, 222, the offset between the pick heads 210, 214 at the transfer position can be calculated.

In step 320, the turret pick head 214 then retrieves the electronic device from the flipper pick head 210 at the transfer position.

In step 322, the turret pick head 214 transfers the electronic device to the processing station. This is done by rotating the turret body 212 which in turn moves the turret pick head 214 carrying the electronic device to the processing station.

In step 324, the flipper body 208 is moved back along the X and Y axes to the original position it was at when the apparatus 200 was initially set up.

Steps 310-324 are repeated until all the electronic devices in the receiving plate are transferred to the processing station. Each adjustment in step 318 is done dynamically in the sense that when the flipper body 208 and the turret body 212 rotates to bring a next pair of pick heads 210, 214 to the transfer position for the next device transfer, the X/Y driving mechanism 226 moves the flipper body 208 to a new location based on the offset for this next pair of pick heads 210, 214.

Figure 6A:
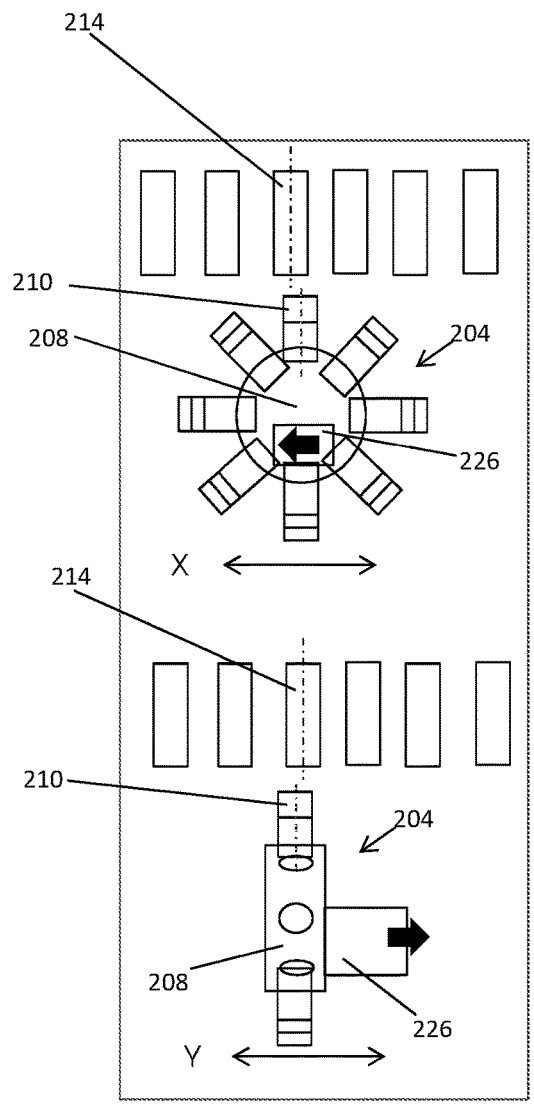
FIG. 6(a) and FIG. 6(b) respectively show relative positions between a flipper pick head and a turret pick head of the apparatus of FIG. 2 before and after an adjustment step.
Figure 6B:
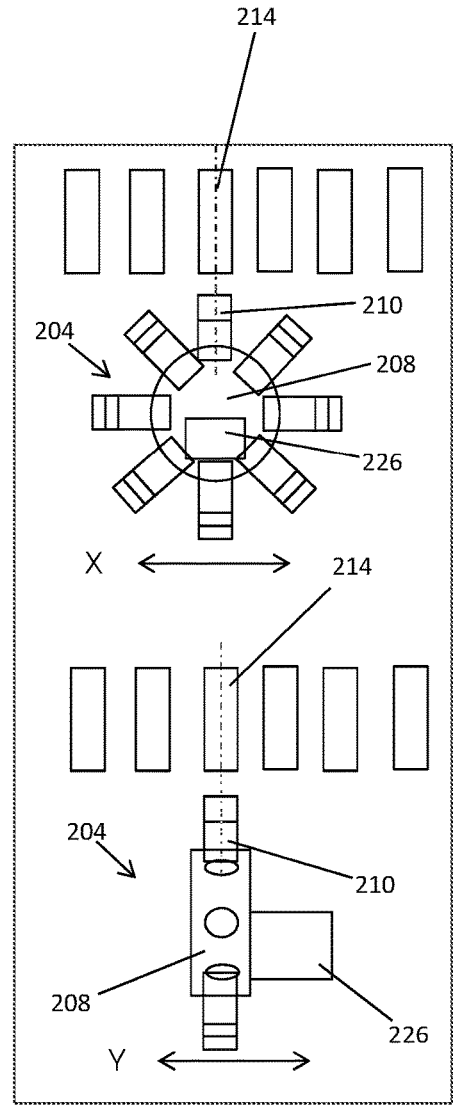

FIGS. 6(a) and 6(b) respectively show the relative positions between the flipper pick head 210 and the turret pick head 214 at the transfer position before and after the adjustment in step 318. As shown in FIG. 6(a), prior to the adjustment, the flipper pick head 210 and the turret pick head 214 are misaligned in both the X and Y directions. FIG. 6(b) shows how after the adjustment, the flipper pick head 210 and the turret pick head 214 are aligned in both the X and Y directions.

Figure 7:
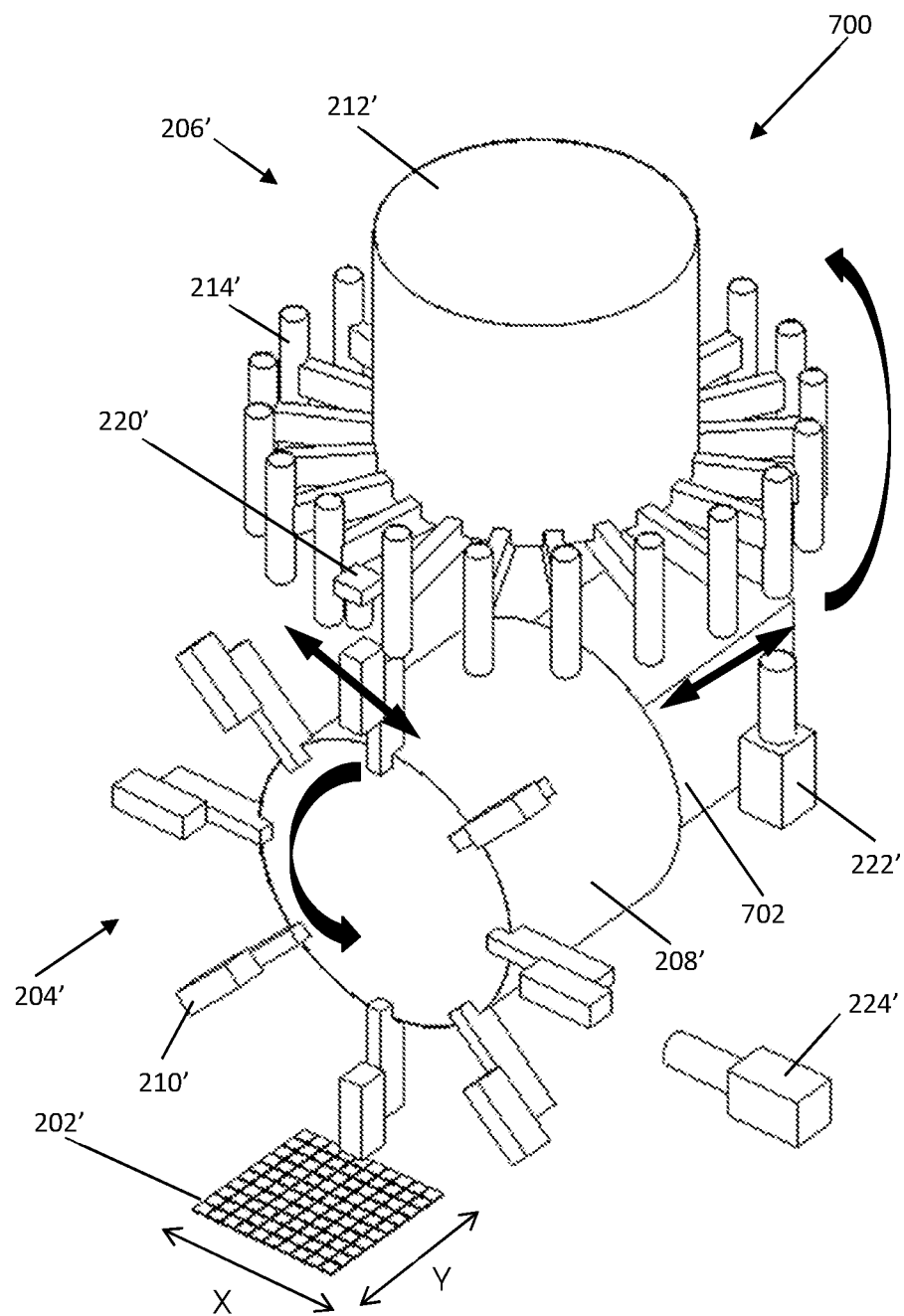
FIG. 7 shows a perspective view of an apparatus for transferring electronic devices from a holding unit to a processing station according to a second embodiment of the present invention.

FIG. 7 shows a perspective view of an apparatus 700 for transferring electronic devices from a holding unit in the form of a receiving plate 202' to a processing station (not shown) according to a second embodiment of the present invention. The apparatus 700 is similar to the apparatus 200 and thus, the same parts will have the same reference numerals with the addition of prime.

As shown in FIG. 7, the apparatus 700 also comprises a vertically rotating flipper 204', a horizontally rotating main turret 206', a down-look camera 220', an up-look camera 222' and a side-look camera 224'. The apparatus 700 also includes a computing unit and a storage device similar to that of the apparatus 200.

However, the adjusting mechanism of the apparatus 700 is in the form of a single axis driving mechanism 702, instead of the X/Y driving mechanism 226 as in the apparatus 200. In particular, this single axis driving mechanism 702 comprises a casing which holds a motor that is operable to move shafts connected to the flipper body 208', so as to move the flipper body 208' along a single axis, specifically, the Y axis, as shown in FIG. 7.

In use, the apparatus 700 is also initially set up with the flipper pick heads 210' and the turret pick heads 214' in respective actual stopping positions. The apparatus 700 then performs a method similar to method 300, except that in step 318, the position of the flipper body 208' is adjusted by moving the flipper body 208' along the Y axis with the single axis driving mechanism 702 and moving the flipper body 208' along the X axis by rotating the flipper body 208' anti-clockwise. Rotating the flipper body 208' anti-clockwise causes the tangential travel of the flipper pick head 210' at the transfer position, therefore adjusting the relative position between the flipper pick head 210' and the turret pick head 214' at the transfer position.

Figure 8A:
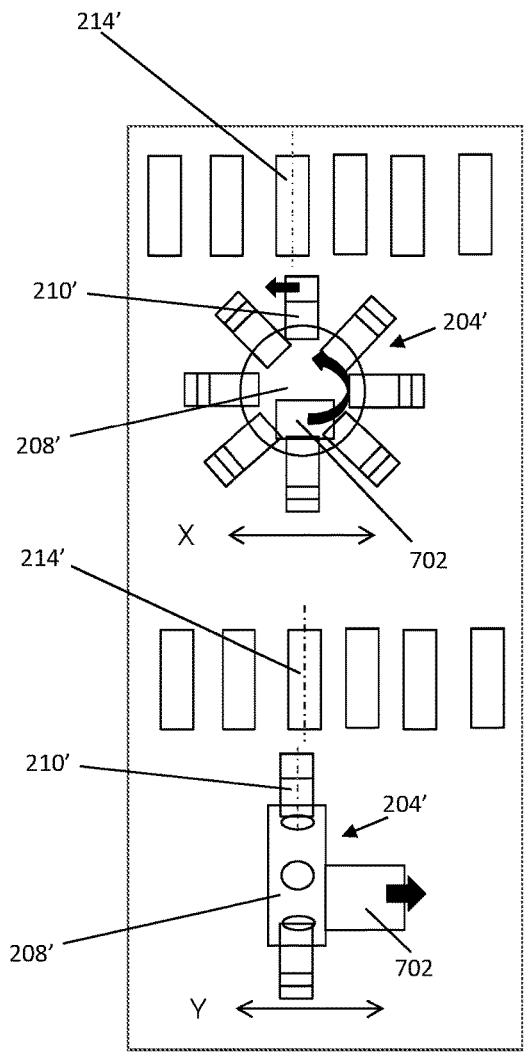
FIG. 8(a) and FIG. 8(b) respectively show relative positions between a flipper pick head and a turret pick head of the apparatus of FIG. 7 before and after an adjustment step.
Figure 8B:
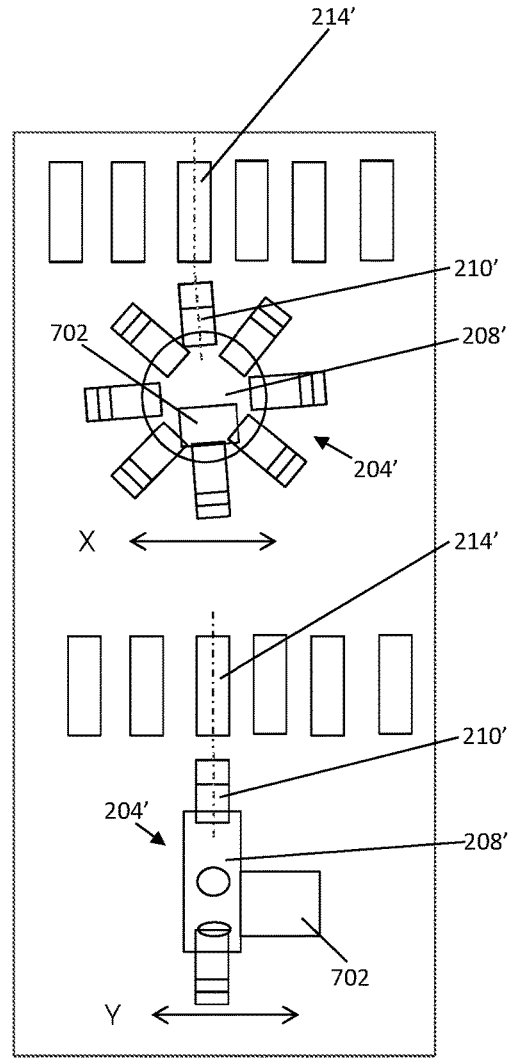

FIGS. 8(a) and 8(b) respectively show the relative positions between the flipper pick head 210' and the turret pick head 214' at the transfer position before and after the adjustment as described above. As shown in FIG. 8(a), the flipper pick head 210' and the turret pick head 214' are initially misaligned in both the X and Y directions. After the adjustment, as shown in FIG. 8(b), the flipper pick head 210' and the turret pick head 214' are aligned in both the X and Y directions. However, the flipper pick head 210' (and hence, the electronic device it is carrying) is tilted with respect to the turret pick head 214' and thus, the turret pick head 214' will retrieve the device at this tilt angle. The angle of this tilt is usually negligible for small adjustments of the X position of the flipper pick head 210' and hence, the electronic device can still be securely retrieved by the turret pick head 214' at the center of the pick head 214'. Nevertheless, if larger adjustments of the X position of the flipper pick head 210' are needed, the angle of the tilt may be significant and this may affect the retrieval of the electronic device by the turret pick head 214'. In such situations, it is preferable to use the apparatus 200 instead of the apparatus 700.

Various modifications will be apparent to those skilled in the art.

For example, instead of having rotating mechanisms 210, 214, 210', 214' with their axes of rotation perpendicular to each other, the apparatus 200, 700 may comprise rotating mechanisms with their axes of rotation parallel to each other. For instance, the apparatus 200, 700 may comprise two horizontally rotating mechanisms. Alternatively, the apparatus 200, 700 may comprise two vertically rotating mechanisms. The apparatus 200, 700 may also comprise more than two rotating mechanisms with axes of rotation either perpendicular or parallel to one another. This is as long as the rotating mechanisms are configured to transfer the electronic devices from one's pick head to another's and the adjusting mechanism is configured to adjust the relative positions between the pick heads so that the pick heads retrieve the electronic devices at their centers.

Furthermore, the adjusting mechanism of the apparatus 200, 700 can be configured to move the turret body 212, 212' instead of the flipper body 208, 208' or to move both the turret body 212, 212' and the flipper body 208, 208'. However, moving the turret body 212, 212' is generally more difficult than moving the flipper body 208, 208' due to the weight of the main turret 206, 206'. Moreover, the turret pick heads 214, 214' are configured to transfer the electronic devices to the processing station. Moving the turret body 212, 212' affects the alignment of the turret pick heads 214, 214' with the processing station and as a result, further re-adjustments are needed. Thus, it is preferred to move only the flipper body 208, 208'.

In addition, the imaging mechanism need not comprise two separate cameras 220, 222, 220', 222'. Instead, the imaging mechanism can comprise a single camera. For example, there can be a single down-look camera connected to a stationary part of the apparatus 200, 700, with its center positioned above the center of the first expected holder stopping position (which is aligned with the first expected handler stopping position). In this case, the flipper body 208, 208' and the turret body 212, 212' may be rotated in turn for the single down-look camera to capture images of all the pick heads 210, 214, 210', 214', so as to calculate their deviations from the first expected handler and first expected holder stopping positions. It is however preferred to have separate cameras due to the small degrees of deviation involved. With separate cameras, the cameras can be opposite surfaces with the retrieving elements (e.g. suction holes) of the pick-heads 210, 214, 210', 214'. On the other hand, with the single down-look camera as described above, the camera will be pointing towards the back of the turret pick heads 214, 214'. As the turret pick heads 214, 214' may be slightly tilted, the deviation of the back of a pick head 214, 214' from an expected stopping position may not be the same as that of the surface with the retrieving element. Thus, the offset calculated may be less accurate with the use of a single down-look camera.

The apparatus 200, 700 may also comprise more than two cameras and the orientation (either up-look or down-look) of these cameras may vary. For example, the cameras may be all up-look cameras, all down-look cameras or a mixture of both. As mentioned above, it is preferred that the cameras are pointed at the surfaces of the pick-heads with the retrieving elements. Hence, the orientation of the cameras is preferably determined based on the orientation of the pick-heads. The cameras may also be in positions different from those in the apparatus 200, 700 as long as they are located with their centers opposite the centers of expected stopping positions.

Moreover, the apparatus 200, 700 need not comprise a side-look camera 224. Instead, the adjustment can be performed based on only the offset between the specific pair of pick heads 210, 214 (or 210', 214') as determined from the images captured using the up-look and down-look cameras 220, 222.

Also, it is not necessary to calculate the offset for every specific pair of flipper pick head 210, 210' and turret pick head 214, 214'. Instead, the processor may be configured to determine the turret pick head 214, 214' that will be retrieving the electronic device from each flipper pick head 210, 210' based on the initial set up of the apparatus 200, 700, and then calculate the offsets for only these pairs of pick heads 210, 214, 210', 214'.

In addition, although in method 300, images of the turret pick heads 214, 214' are captured before images of the flipper pick heads 210, 210', this is not necessary and the images of the flipper pick heads 210, 210' may be captured first. Further, the offsets need not be calculated using vectors.

The invention claimed is:

1. An apparatus for transferring electronic devices from a holding unit to a processing station, the apparatus comprising:
   a first rotating mechanism comprising a plurality of handlers, each handler configured to retrieve an electronic device from the holding unit and to move the electronic device to a transfer position;
   a second rotating mechanism comprising a plurality of holders, each holder configured to retrieve the electronic device from a respective handler at the transfer position and to transfer the electronic device to the processing station;
   an imaging mechanism configured to capture an image of each handler and each holder;
   a processor configured to calculate an offset between each holder and the respective handler at the transfer position using the captured images; and
   an adjusting mechanism configured to adjust a relative position between each holder and the respective handler at the transfer position based on the calculated offsets prior to the electronic device being retrieved by the holder.

2. The apparatus according to claim 1, wherein the holders and handlers each comprises a retrieving element configured to retrieve the electronic device, and
   wherein the captured images comprise images of the retrieving elements.

3. The apparatus according to claim 1, wherein the imaging mechanism comprises a first camera configured to capture the images of the handlers and a second camera configured to capture the images of the holders.

4. The apparatus according to claim 1, wherein the imaging mechanism comprises both a down-look camera and an up-look camera.

5. The apparatus according to claim 1, wherein the adjusting mechanism is configured to move only the first rotating mechanism to adjust the relative position between each holder and the respective handler at the transfer position.

6. The apparatus according to claim 1, wherein the adjusting mechanism is configured to move one or both of the rotating mechanisms along two perpendicular axes.

7. The apparatus according to claim 1, wherein the first and second rotating mechanisms are configured to rotate perpendicular to each other.

8. The apparatus according to claim 7, wherein the first rotating mechanism is configured to rotate vertically and the second rotating mechanism is configured to rotate horizontally.

9. The apparatus according to claim 1, wherein the adjusting mechanism is configured to move one or both of the rotating mechanisms along a single axis.

10. The apparatus according to claim 9, wherein the one or both of the rotating mechanisms is further configured to rotate to adjust the relative position between each holder and the respective handler along a second axis perpendicular to the single axis.

11. The apparatus according to claim 1, further comprising an image capturing device configured to capture an image of each holder after the holder retrieves the electronic device to determine a position of the electronic device relative to the holder.

12. The apparatus according to claim 11, wherein the adjusting mechanism is configured to adjust the relative position between each holder and the respective handler based further on the determined position of the electronic device relative to the holder.

13. The apparatus according to claim 1, wherein the offsets are calculated by:
   determining first deviations of the handlers from an expected handler stopping position;
   determining second deviations of the holders from an expected holder stopping position; and
   determining differences between the first and second deviations.

14. The apparatus according to claim 13, wherein the deviations are represented by vectors, and the differences are determined using the vectors.

15. The apparatus according to claim 13, wherein the imaging mechanism comprises cameras positioned opposite the expected handler and holder stopping positions.

16. The apparatus according to claim 15, wherein the expected handler stopping position is located away from the expected holder stopping position.

17. A method for transferring electronic devices from a holding unit to a processing station, the method comprising:
   capturing an image of each of a plurality of handlers;
   capturing an image of each of a plurality of holders;
   calculating an offset between each handler and a respective holder at a transfer position using the captured images;
   retrieving an electronic device from the holding unit and moving the electronic device to the transfer position using a handler;
   adjusting a relative position between the handler and the respective holder at the transfer position based on the calculated offsets; and
   retrieving the electronic device from the handler at the transfer position and transferring the electronic device to the processing station using the holder.

* * * * *